United States Patent [19]

Robinson et al.

[11] Patent Number: 5,536,966
[45] Date of Patent: Jul. 16, 1996

[54] RETROGRADE NWELL CATHODE SCHOTTKY TRANSISTOR AND FABRICATION PROCESS

[75] Inventors: Murray J. Robinson, Falmouth; Christopher C. Joyce, Gorham; Timwah Luk, Scarborough, all of Me.

[73] Assignee: National Semiconductor Corporation, Santa Clara, Calif.

[21] Appl. No.: 290,684

[22] Filed: Aug. 15, 1994

Related U.S. Application Data

[63] Continuation of Ser. No. 949,035, Sep. 22, 1992, abandoned.

[51] Int. Cl.$^6$ .................................................... H01L 29/48
[52] U.S. Cl. ........................ 257/474; 257/475; 257/477; 257/479; 257/655
[58] Field of Search ............................... 257/474, 475, 257/477, 479, 655

[56] References Cited

U.S. PATENT DOCUMENTS

| | | |
|---|---|---|
| 4,498,227 | 2/1985 | Howell et al. . |
| 4,799,098 | 1/1989 | Ikeda et al. . |
| 4,849,344 | 7/1989 | Desbiens et al. . |
| 4,943,742 | 7/1990 | Fukushima . |
| 4,982,244 | 1/1991 | Kapoor ................... 257/477 |

OTHER PUBLICATIONS

IBM Technical Disclosure Bulletin, vol. 17, No. 6, Nov. 1974, New York pp. 1609–1610, R. W. Knepper.
European Patent Application Publication No. 0500733A2.
Patent Abstract of Japan, vol. 7, No. 292 (E–219)(1437), Dec. 27, 1983 and JP–A–58 166 765 Tokyo Shibaura Denki, Oct. 1, 1983.

*Primary Examiner*—Edward Wojciechowicz
*Attorney, Agent, or Firm*—Chris A. Caserio; Thomas L. Bohan

[57] ABSTRACT

An improved Schottky transistor structure (6), including a bipolar transistor structure (7) and a Schottky diode structure (8), is formed by retrograde diffusing relatively fast diffusing atoms to form a localized retrograde diode well (9) as the substrate for the Schottky diode structure. An expanded buried collector layer (11) formed of relatively slow diffusing atoms underlies the base and collector regions of the bipolar transistor structure (7) and the retrograde diode well (9). A diode junction (10) is formed by expanding the base contact of the bipolar transistor structure to include the surface of the retrograde diode well. Preferably, the diode junction is a Platinum-Silicide junction. The improved Schottky transistor structure may be formed as part of a bipolar junction transistor fabrication process or a BICMOS integrated circuit fabrication process wherein the buried diode layer may be formed at the same time as the buried collector layer of the bipolar transistor structure and the retrograde diode well may be formed at the same time as the sub-emitter collector region of the bipolar transistor structure. The buried collector layer definition mask is also a buried diode layer definition mask, the sub-emitter collector region definition mask is also a retrograde diode well definition mask, and the bipolar contacts definition mask is also a diode junction contact definition mask.

9 Claims, 5 Drawing Sheets

RETROGRADE NWELL CATHODE SCHOTTKY TRANSISTOR AND FABRICATION PROCESS

This is a continuation of application Ser. No. 949,035, filed Sep. 22, 1992, now abandoned.

CROSS-REFERENCE TO RELATED PATENT APPLICATIONS

This invention is related to the U.S. patent applications of Murray Robinson, Christopher Joyce, and Timwah Luk, Ser. No. 803,214, filed Dec. 6, 1991, for Schottky Diode Structure With Localized Well, now U.S. Pat. No. 5,150,177 and Ser. No. 898,196, filed Jun. 12, 1992, for Fabrication Process For Schottky Diode With Localized Diode Well, now U.S. Pat. No. 5,268,316.

TECHNICAL FIELD

The present invention relates to an improved Schottky transistor structure incorporating a retrograde localized well under an extended base contact, establishing a Schottky diode structure in conjunction with the bipolar transistor structure. The present invention is applicable to bipolar and BICMOS integrated circuits, with fabrication processes that lead to faster, more reliable Schottky transistor structures. More particularly, the present invention uses selected mask sequences from bipolar fabrication steps with modification of the masks according to the invention to form the improved Schottky transistor.

BACKGROUND ART

In the field of bipolar and integrated circuits, particularly those circuits used in transistor-transistor logic (TTL) technology, bipolar junction transistors are sometimes "clamped" so as to restrict the forward biasing of the collector-base junctions. This is to prevent excess minority carrier storage in the base region while the transistor is "on," i.e., to prevent the transistor's going into "deep saturation" while conducting, a condition which severely limits the speed with which the transistor can be switched off. Deep saturation is particularly undesirable in the "pull-up" and "pull-down" transistors used in binary logic circuits where switching speed is essential.

For many applications, the voltage-clamping device of choice for this task has been the Schottky diode, which has a sharp knee at a low voltage in the forward i-v curve and also a reasonably low reverse saturation current. The collector-base junction is shunted by a Schottky diode. The clamping is effected by shunting the transistor's collector-base junction with a Schottky diode oriented so as to be forward-biased when the collector-base junction is forward-biased.

Modern Schottky diodes are formed by laying down a metallic film on a semiconductor. Provided the semiconductor carrier concentration is not too high, a rectifying junction—the Schottky junction—is at the metal/semiconductor interface; its key characteristics—Schottky barrier and reverse saturation current—are determined by the semiconductor carrier concentration at that interface. (If the concentration is too high, the interface will be ohmic rather than rectifying; there will not be a Schottky diode established.)

Prior art integrated circuits incorporating Schottky diodes are typically formed by depositing metal on the surface of an epitaxial layer of semiconductor material. See, for example, U.S. Pat. No. 4,849,344 issued to Desbiens et al. in 1989 and U.S. Pat. No. 4,943,742 issued to Fukushima in 1990. In many cases this same epitaxial layer forms a part of the collector region of the bipolar transistor. The base region is of opposite type semiconductor from that of the epitaxial layer (P type if the epitaxial layer is N type, and conversely). The transistor structure also includes an emitter region of the same conduction type as the collector region. Fabrication procedures for typical prior art transistor structures have been described in U.S. Pat. No. 3,648,125 issued to Peltzer in 1972, and U.S. Pat. No. 4,498,227 issued to Howell et al. in 1985. The monocrystalline epitaxial layer is typically doped uniformly with donors or acceptors and formed by vapor deposition on a semiconductor substrate of opposite conductivity type: i.e., if the substrate is N type material, the epitaxial layer will be N type, and conversely. (The substrate is usually of the same conductivity type as the base region of the transistor to be formed, though with a lower carrier concentration.) The epitaxial layers produced in most prior-art fabrication processes are doped essentially uniformly, with a typical surface concentration of about $1-3\times10^{16}$ donors/cc, leading to a sheet resistance of about 3500–4500 ohms/sq and a bulk resistivity of about 0.5 ohm-cm nominal. Schottky junctions formed at the surface of such layers have a turn-on voltage of about 0.45V@30 nA/sq. micron, and low reverse saturation current.

Unfortunately, the prior art Schottky structures have several characteristics that limit their usefulness as voltage clamps for collector-base junctions in certain important integrated circuits. These problems are principally 1) a high series resistance within the diode—which causes the "clamped" voltage to rise as a function of current through the Schottky diode—and 2) relatively wide carrier concentration variations on the semiconductor side of the Schottky interface—resulting in clamping voltage variations (and hence switching time variations) from one Schottky transistor to the next. These problems are described in the cross-referenced U.S. Pat. No. 5,150,177, of Robinson et al., entitled Schottky Diode Structure With Localized Well. In summary, when a prior art Schottky diode that suffers from the above-mentioned problems is part of a transistor, the result is a slower, less-predictable transistor than is otherwise achievable.

As illustrated in FIG. 1, a cross-sectional view of a typical prior art Schottky transistor configuration, the transistor portion includes a highly-doped collector surface region 1, an epitaxial layer 3, an underlying buried collector layer 4, and a base region 5. A Schottky contact 2 at the surface of the epitaxial layer 3 comprises in conjunction with the epitaxial layer 3 a Schottky diode structure that serves to limit voltage across the collector-base junction and to divert minority carriers away from the base region 5. This N type epitaxial layer is doped as previously indicated, with donor concentration relatively uniform.

Although the epitaxial layer's donor concentration of $1-3\times10^{16}$/cc produces a Schottky diode with good junction characteristics, it also leads to a high series resistance within the diode. This high resistance results in a current-dependent voltage drop through the bulk of the diode which adds to the drop across the Schottky junction during current flow, thus causing the "clamped" voltage across the collector-base junction to drift upward, leading to a minority-carrier build-up within the base. In order to provide a Schottky diode with adequate shunting capacity at a fixed voltage, it is necessary to reduce the diode's bulk resistance—i.e., the resistance of the current pathway through the semiconductor—to the rest of the circuit. The usual ways to decrease the resistance of a pathway are: a) decrease the resistivity of the material making up the pathway, b) decrease the pathway length, c) increase the pathway cross-section. These methods are not directly practicable in the current state of the art. That is, it is not possible to decrease the resistivity of the epitaxial layer without degrading the Schottky junction and other circuit components. Moreover, because of the other configurational requirements of the circuit structure, it is generally not possible to reduce the length of the path through the epitaxial layer. Finally, any increase in the diode's cross-section is at the cost of increasing parasitic diode capacitance and decreasing the number of active structures that can be formed on a given substrate. Thus, within the prior art constraints, overcoming the problem of high diode resistance must be balanced against the problems associated with an increase in the structure's dimensions.

The other problem associated with prior art Schottky diode fabrication methods is the above-mentioned variation in donor concentration from one device to the next. For a number of reasons, donor concentrations in the epitaxial layer can vary by as much as ±30% from semiconductor "wafer" to wafer, or within a wafer. In prior-art structures these variations resulted from the way in which donor concentrations were achieved; that is, the growth of the epitaxial layer controlled the donor levels in the wafer. In fact, actual donor concentrations in the epitaxial layer are not known until after the deposition process is completed. This fluctuation translates into characteristic variability for a given fabrication lot; it directly affects the forward voltage drop and the reverse current at the metal-semiconductor interface. It also directly affects the series resistance through the bulk of the epitaxial layer. In effect, the forward voltage drop, the reverse current leakage rate, and the series resistance may all vary significantly from one diode to the next.

Recent innovations in integrated circuit bipolar NPN transistor structure fabrication methods have led to increasing localization and miniaturization of active areas. See, for example, co-pending application Ser. No. 07/942,977, of Joyce et al., filed Sep. 10, 1992, entitled Improved Lateral PNP Transistor In A BICMOS Process. These new techniques include implanting relatively slow-diffusing N type atoms in a P type substrate (so as to form a buried $N^+$ collector layer for the bipolar structure), using a collector-fabrication sequence: mask, etch, and implant. Next, a "sub-emitter collector region" of relatively fast-diffusing N type atoms in an $N^{++}$ concentration is implanted into a portion of the buried collector layer. The implant is provided by means of a sub-emitter collector mask, etch, and implant sequence. The epitaxial layer of semiconductor material, with an $N^-$ concentration of donors, is then deposited on the substrate. The donor concentration in this new epitaxial layer, typically about $1-3\times10^{15}$ donors/cc, has a lower donor concentration than is present in earlier prior-art epitaxial layers. The reason for this reduction is to minimize parasitic collector/base capacitance in the bipolar structure and to localize sub-elements of the integrated circuit, both increasing concerns as integrated circuits continue to be miniaturized.

In the recent fabrication processes, thermal cycling causes the sub-emitter collector region to up-diffuse, or "retrograde diffuse" through the epitaxial layer in a well-defined manner. This retrograde diffusion thus establishes a donor concentration gradient through these localized areas of the epitaxial layer. Near the epitaxial layer surface the donor concentration is lowest; near the epitaxial layer/substrate interface the concentration is greatest. The resistivity of the sub-emitter collector region therefore decreases from that region's surface to the underlying substrate. The donor concentration, at least in this region, is no longer controlled by the growth of the epitaxial layer; instead, the extent of the implant is the dominant factor.

Continuing this new procedure, isolation regions of silicon dioxide are formed—using a conventional active-area mask, etch, and growth sequence—in order to provide surface isolation between active areas. In the final stages of this new fabrication process, contact deposition regions are formed through a contact definition mask, etch and deposition sequence, using a passivating silicon nitride layer as the mask. A first metal is then deposited in the contact regions. (One way to establish a Schottky clamping transistor, is to extend the metal deposited over the base region to cover the surface of the adjacent epitaxial layer.) A second metal layer is then deposited over the first metal layer. It should be noted that an interlayer dielectric may be formed on the first metal layer, prior to second metal layer deposition, so as to separate the two metal layers.

A disadvantage of the reduced donor concentration in the epitaxial layer of the described structure is that the relatively light doping is unsuitable for a Schottky diode of the type needed. A diode formed utilizing that substrate has a much higher turn-on voltage as well as a higher reverse current leakage than would be acceptable or useful. Also, as addressed earlier, the series resistance through the epitaxial bulk is excessive with this light doping. All of these characteristics in a Schottky transistor would make it a less-than-optimal collector-base shunt for limiting minority carriers in the base region. Furthermore, the use of the low donor-concentration epitaxial layer as part of the Schottky diode would still result in performance variability problems from one diode to the next because the deposition process remains the same; only the donor concentration is lower.

As indicated, these problems have been noted and addressed in U.S. Pat. No. 5,150,177 for a generic Schottky diode. That disclosure describes a method of retaining the advantages of a relatively lightly-doped epitaxial layer while increasing the donor concentration in the Schottky diode region. That donor concentration is achieved by forming a localized NWell below the metal-semiconductor interface of the diode at the same time that the NWell of a PMOS transistor is formed. This localized well, of a size similar to that of the PMOS NWell, provides a pathway with increasing donor concentration and hence provides a low-resistance pathway for the current, while continuing to allow a suitably high semiconductor resistance at the metal/semiconductor interface. In order to use this localized NWell technique in the fabrication of a Schottky transistor—i.e., to incorporate it into the fabrication of a bipolar junction transistor—it would have to be modified in order to permit the Schottky diode to be tailored to the dimensions of the transistor's active area. It would, for example, be unacceptable to simply incorporate a large localized Schottky diode well. This would increase the size of the transistor, and hence transistor capacitance, and decrease the device density possible on a given wafer.

Therefore, what is needed is an improved Schottky transistor formed using a Schottky diode as a collector-base junction clamp, where the Schottky diode has low reverse-leakage, a relatively low turn-on voltage and little characteristic variability from one structure to another. What is also needed is a Schottky transistor with a Schottky diode structure that has a relatively low-resistance current path through the bulk of the semiconductor material. Such a structure would increase the speed at which minority carriers are diverted away from the collector-base junction of the bipolar transistor and would minimize the required size of the transistor. Further, what is needed is a Schottky transistor with a Schottky diode structure that can be tailored to the specific current-diverting requirements of the particular bipolar transistor. Still further, what is needed is a new bipolar transistor fabrication process that includes the fabrication of the new clamping Schottky diode using existing bipolar mask sequences modified to include the formation of the new Schottky diode structure.

OBJECTS OF THE INVENTION

It is therefore an object of the present invention to provide an improved bipolar junction transistor with Schottky diode clamping means so as to restrict the forward biasing of the collector-base junctions. The improved Schottky transistor of the invention utilizes a Schottky diode structure that has low reverse leakage, a relatively low turn-on voltage, and a relatively low-resistance current path through the bulk of the diode substrate. The invention utilizes a retrograde well in the epitaxial layer to form the substrate of the Schottky diode, wherein a relatively low concentration of donors at the diode junction provides reasonable reverse-leakage and a relatively low turn-on voltage. A relatively high concentration of donors in the bulk of the retrograde well provides a low series resistance for the diode current path. As a result, minority carrier storage in the base region is minimized and a faster-switching transistor is achieved.

Another object of the present invention is to provide a relatively simple means of fabricating an improved Schottky transistor by incorporating the fabrication of the new Schottky diode into the existing fabrication process for bipolar junction transistors. The invention includes the fabrication of the new Schottky diode using bipolar mask sequences modified to include the formation of the new Schottky diode. Forming the diode substrate as a localized well tailored to the particular needs of a specific bipolar transistor yields Schottky transistors with more uniform characteristics from wafer to wafer and within a wafer because the donor concentration can be more tightly controlled in the formation of the donor well than it can in the formation of the epitaxial layer.

Still another object of the present invention is to provide new mask structures and new mask, etch, implant and oxidation sequences for fabricating the new Schottky transistor structure.

DISCLOSURE OF THE INVENTION

The present invention achieves the above objectives by providing a retrograde diode well in the epitaxial layer of the bipolar transistor. The retrograde well lies under the metal-semiconductor interface of the Schottky diode used to clamp the transistor. The well comprises semiconductor material that has essentially the same, or a slightly higher, concentration of donors at the diode junction when compared to prior-art Schottky diodes. This surface concentration, nominally $2\times10^{16}$ donors/cc, results in a diode with low reverse leakage and with a turn-on voltage of about 0.425 V@30 nA/sq.micron—essentially the same characteristics as prior-art Schottky diode junctions. Beyond the diode junction, however, the similarities end. The retrograde diode well of the present invention has a steadily increasing donor concentration down through to the underlying buried collector layer. This increasing concentration provides a current pathway with reduced series resistance, thereby minimizing the current-dependence of the clamping voltage of the collector-base junctions. Near the interface between the retrograde well and the underlying buried collector layer, in fact, the donor concentration may exceed $1\times10^{17}$ donors/cc.

The increasing donor concentration down through the well of the present invention results in a decrease in resistivity from the diode junction down to the underlying substrate. The ability to provide a Schottky diode with decreasing resistivity down through the retrograde diode well yields suitable clamping without the need to increase the diode's dimensions. Utilization of a retrograde well of known donor concentration and controlled up-diffusion provides a Schottky diode substrate, and thus a Schottky transistor, of well-defined characteristics and of minimal fluctuations in operating characteristics from one transistor to the next.

The invention also provides an improved bipolar transistor by incorporating the fabrication of the improved Schottky diode region into existing bipolar transistor fabrication sequences, whether the sequences are strictly bipolar or BICMOS. The bipolar structure includes the buried collector layer of relatively slow-diffusing N type atoms formed in a substrate of P type semiconductor material. A well of relatively fast-diffusing N type atoms in an $N^+$ concentration is subsequently implanted into a portion of the buried collector layer. This well of relatively fast-diffusing atoms forms the localized sub-emitter collector region that later up-diffuses into the epitaxial layer deposited over the entire substrate. The localized sub-emitter collector region underlies the emitter and active base layer of the bipolar transistor substrate.

According to the present invention, the clamping Schottky diode is formed by using the buried collector layer of the transistor and a sub-emitter collector-like region. The buried collector layer is common to the transistor structure and the Schottky diode structure and this is of key importance to the special utility of the invention. A localized well of relatively fast-diffusing N type atoms, the same type used to form the transistor's sub-emitter collector region, is permitted to up-diffuse to the surface of the epitaxial layer to form the retrograde diode well with a donor concentration gradient as previously noted. An alternative Schottky transistor structure of the present invention involves the elimination of the sub-emitter collector region while leaving the diode's retrograde well in place. This results in a Schottky transistor with a higher breakdown voltage than would be the case for Schottky transistors formed using the prior-art bipolar or BICMOS fabrication processes.

The present invention adds to and enhances the bipolar transistor fabrication process by including the fabrication of the retrograde diode well in the active area of the transistor. The retrograde well enhances the portion of the epitaxial layer in the region underlying the Schottky contact area. This is of importance in the particular bipolar fabrication process contemplated for as previously stated, the epitaxial layer of the present invention is very lightly doped and a Schottky diode using such an epitaxial layer as its substrate would require a higher-than-desirable turn-on voltage, and it would have a very high series resistance.

The present invention is also seen as providing an improved BICMOS integrated circuit incorporating the improved Schottky diode to produce a Schottky transistor, as the CMOS transistor structure—including complementary NMOS and PMOS transistor structures—is being fabricated. In the BICMOS fabrication process, the sub-emitter collector region of the bipolar transistor and the NWell of the CMOS transistor are implanted simultaneously. The retrograde diode well of the present Schottky transistor can be implanted at the same time.

The remaining steps in the fabrication of the present Schottky transistor may be incorporated into the BICMOS fabrication steps, resulting in the formation of a new structure without adding any new BICMOS fabrication steps. Furthermore, the associated BICMOS structures on a common substrate are normally separated by field oxide regions which provide enhanced isolation. The formation of these field oxide regions adds to the fabrication considerations and reduces active structure space availability. It is therefore important to note that the improved Schottky transistor of the present invention utilizes the advantages of a retrograde-well Schottky diode without the need to separate the transistor region from a stand-alone Schottky diode with a field oxide region.

According to the invention, a buried collector layer definition mask, etch and implant sequence, used to implant relatively slow-diffusing N type atoms, is modified to construct the buried collector layer definition mask to provide not only a mask with a buried collector layer opening for the transistor region, but to expand the area of that buried collector layer to the extent necessary such that it will underlie the Schottky diode region as well.

The next major step in the process is to form the transistor's sub-emitter collector region by using a sub-emitter collector definition mask, etch and implant sequence to implant relatively fast-diffusing N type atoms in a portion of the buried collector layer. According to the invention, the retrograde diode well is fabricated by constructing the sub-emitter collector definition mask to act not only as a sub-emitter collector definition mask, but as a retrograde diode well definition mask also, with a retrograde diode well defining opening over the buried diode layer of the improved bipolar structure. Alternatively, the sub-emitter collector definition mask, etch and implant sequence may be modified to omit implantation of the relatively fast-diffusing N type atoms to form the sub-emitter collector region. Instead, the retrograde diode well definition mask, etch and implant sequence may be carried out alone.

The fabrication process involves at least one annealing step after deposition of the relatively lightly-doped epitaxial layer and formation of the collector, base and emitter regions of the bipolar transistor structure in the epitaxial layer. The annealing step produces the up-diffusion of the relatively fast-diffusing N type atoms implanted in the buried collector layer forming the sub-emitter collector region and the up-diffusion of the same relatively fast-diffusing N type atoms distributed from the buried diode layer through the epitaxial layer to the surface of the epitaxial layer, thereby forming the retrograde diode well of the Schottky diode of the improved Schottky transistor.

The diode junction of the Schottky diode region is formed by constructing a bipolar transistor contacts definition mask to form a diode junction definition mask with diode junction defining opening over the surface of the retrograde diode well. The bipolar active area contacts and the diode junction are formed by a bipolar transistor contacts mask and deposition sequence wherein a refractory metal is deposited on the surface of the entire structure, thereby forming a metal-silicide composite in all regions containing doped semiconductor material. In the preferred embodiment of the invention, the refractory metal is Platinum. The fabrication of the improved Schottky diode structure as part of the improved Schottky transistor is completed by constructing a Metal 1 definition mask as a diode Metal 1 definition mask including diode Metal 1 defining openings over the diode junction region.

In addition to the improved Schottky transistor structure, the present invention also provides new bipolar transistor photo-definition masks including the new buried collector layer definition mask also forming an expanded buried collector layer definition mask, a new sub-emitter collector layer definition mask also forming the retrograde diode well definition mask, a new bipolar transistor contacts definition mask also forming the diode junction definition mask, and a new Metal 1 definition mask also forming the diode Metal 1 definition mask.

DESCRIPTION OF PREFERRED EXAMPLE EMBODIMENTS AND BEST MODE OF THE INVENTION

Figure 1:
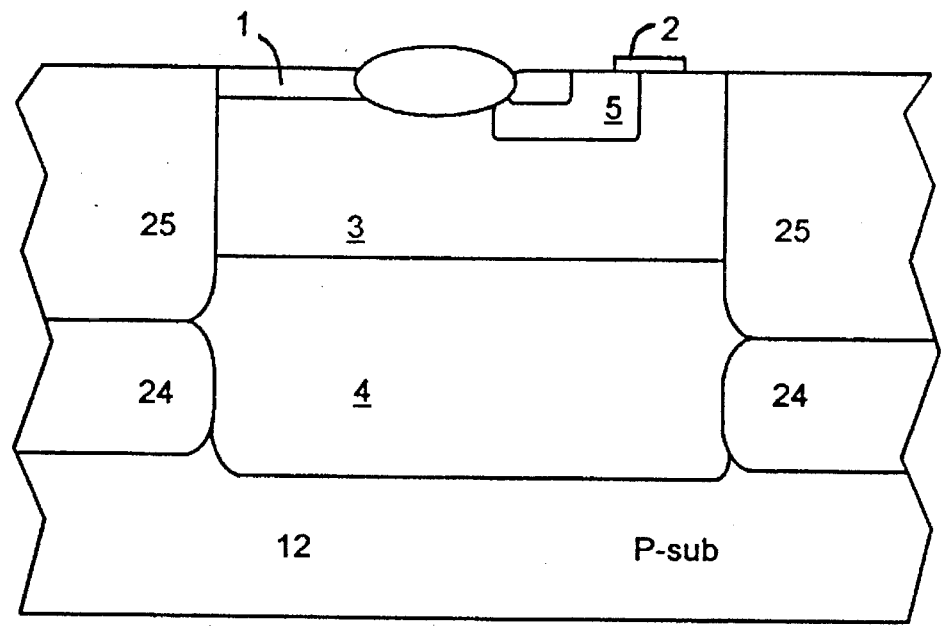
FIG. 1 is a simplified diagrammatic elevation view of a prior art Schottky transistor structure.
Figure 9:
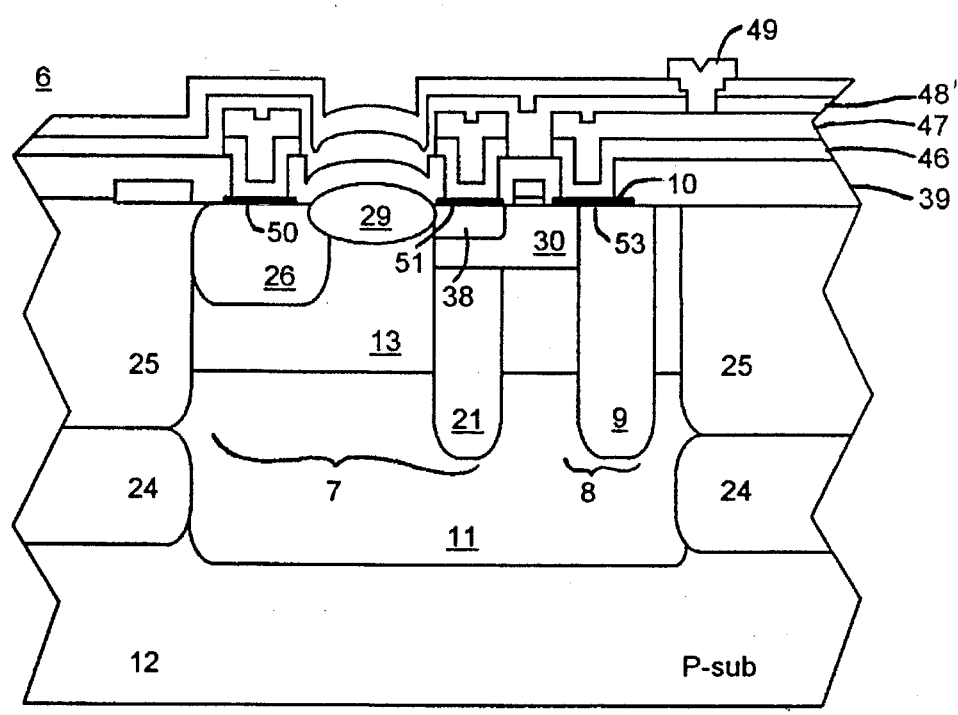
FIG. 9 is a simplified diagrammatic elevation view of the Metal 2 definition mask with the deposited Metal 2.

An improved Schottky transistor structure 6 according to the present invention includes a bipolar transistor structure 7 and a Schottky diode structure 8 with a retrograde diode well 9 and a diode junction 10, as illustrated in FIG. 9. An expanded buried collector layer 11 of said Schottky transistor 6 and said retrograde diode well 9 form the substrate of said diode junction 10, thereby replacing said prior art epitaxial layer 3 of the prior art Schottky transistor illustrated in FIG. 1. Said retrograde diode well 9 provides a localized retrograde concentration of donors through the substrate underlying said diode junction 10 by the implantation of an $N^+$ concentration of relatively fast-diffusing Phosphorus atoms. Subsequent annealing drives the Phosphorus atoms up from a semiconductor substrate 12 of P type semiconductor material through a lightly doped epitaxial layer 13 of N type semiconductor material and up to an epitaxial layer surface 14.

Replacement of said prior art epitaxial layer 3 with said expanded buried collector layer 11 and said retrograde diode well 9 increases the number of donors available in the substrate underlying said diode junction 10 by up to an order of magnitude. Furthermore, the donor concentration at said diode junction 10 is about $1-3\times10^{16}$—about the same as the donor concentration for a Schottky diode junction of a prior art Schottky transistor with a uniform epitaxial region of an equivalent donor concentration. The advantage of said retrograde diode well 9 lies in the increased donor concentration down through the semiconductor material to said expanded buried collector layer 11. This increasing donor concentration results in a lower series resistance—the overall resistivity of said retrograde diode well 9 is much less than the resistivity of said prior art epitaxial layer 3—thereby reducing the current path rate, resulting in a faster Schottky diode structure 8.

Said improved Schottky transistor structure 6 may be fabricated utilizing either bipolar transistor structure or BICMOS integrated circuit fabrication processes. In the preferred embodiment, the steps of a bipolar transistor fabrication process utilized to fabricate said Schottky transistor structure 6 are illustrated in FIGS. 2–9. It is to be understood, however, that the present invention can be fabricated in a BICMOS fabrication process. New bipolar mask structures are also presented in these figures. Relevant portions of the mask sequence into which the fabrication of said Schottky transistor structure 6 has been incorporated, are as follows:

| Mask No. | Mask Function |
| --- | --- |
| 1.0 | Buried Collector Layer (BCL) Mask |
| 2.0 | Retro Sub-Emitter Collector (SEC) Mask |
| 3.0 | Channel Stop (CHST) Mask |
| 4.0 | Isolation Oxide (ISOX) Mask |
| 5.0 | Sink Implant & ISOX Gettering Mask |
| 6.0 | Field Oxide Mask & Collector Base Surface Spacer (CBSS) Definition Mask |
| 7.0 | Active Strip Mask |
| 9.0 | Base Definition Mask |
| 10.0 | Nitride Etch Mask or Collector Base & Emitter Contact Definition Mask |
| 11.0 | Emitter & Collector Sink Implant Mask (Self-Aligned Transistor Mask) |
| 14.0 | Contact Definition Mask |
| 15.0 | Metal 1 (M1) Deposition Mask |
| 16.0 | VIA Mask (Inter Layer Dielectric Mask) |
| 17.0 | Metal 2 (M2) Deposition Mask |
| 18.0 | Passivation Mask |

Figure 2:
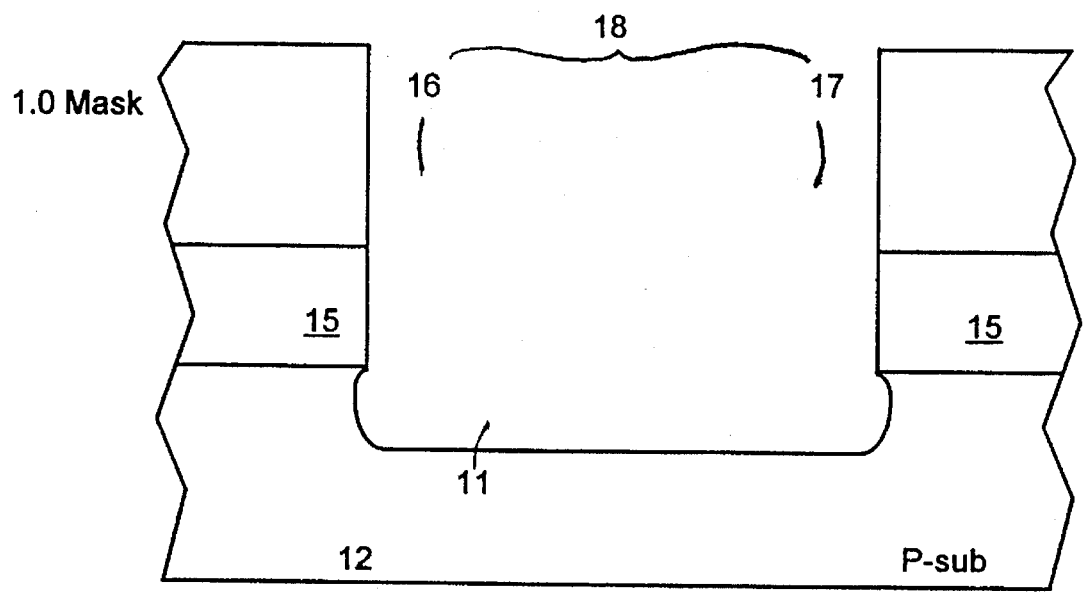
FIG. 2 is a simplified diagrammatic elevation view of the 1.0 BCL mask, etch and implant sequence of the bipolar transistor fabrication process showing the new 1.0 BICMOS buried collector layer definition mask with buried collector opening and the new buried diode layer opening, both forming a single expanded buried collector layer for the new Schottky transistor structure using the fabrication steps described in the preferred embodiment of the invention.

With reference to FIG. 2, said expanded buried collector layer 11 is first formed in said substrate 12 using the 1.0 BCL mask, etch and implant sequence. Relatively slow-diffusing N type Antimony atoms are implanted in said substrate 12 to an $N^+$ concentration through an initial oxide layer 15. The 1.0 mask is formed to expand a buried collector layer definition mask for said bipolar transistor structure 7 with a buried collector defining opening 16, to include a buried diode layer definition mask with a buried diode layer opening 17 for said improved Schottky diode structure 8. Said buried collector layer defining opening 16 and said buried diode layer opening 17 join to form a single expanded buried collector layer defining opening 18 of the 1.0 BCL mask.

Figure 3:
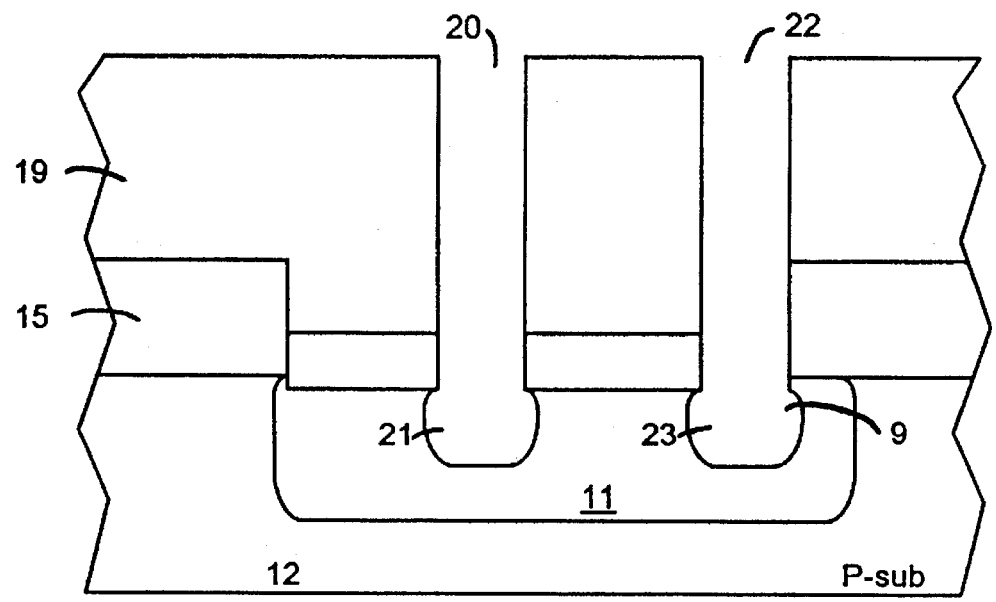
FIG. 3 is a simplified diagrammatic elevation view of the 2.0 mask, etch and implant sequence of the bipolar transistor fabrication process showing the new 2.0 sub-emitter collector definition mask with bipolar transistor sub-emitter collector region opening and the new retrograde diode well definition opening for the Schottky diode structure of the Schottky transistor structure described in the preferred embodiment of the present invention.
Figure 3A:
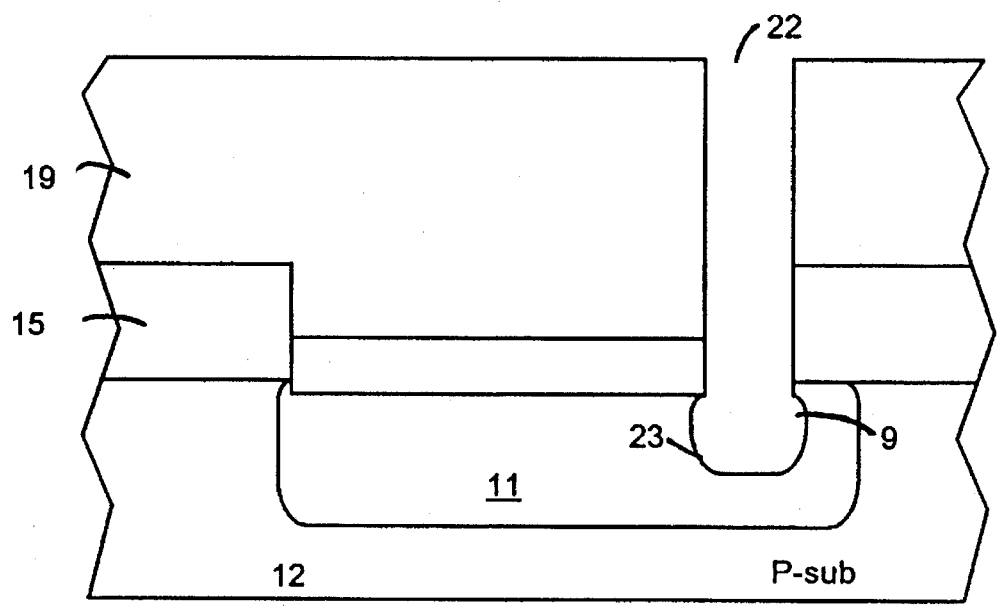
FIG. 3A is a simplified diagrammatic elevation view of the 2.0 mask illustrated in FIG. 3 without the sub-emitter collector region formed above the buried collector layer.

Referring to FIG. 3, a new SEC photo-resist layer 19 is deposited to form the 2.0 retro SEC definition mask. The new 2.0 mask is formed to provide a sub-emitter collector region definition mask with an SEC opening 20 for the formation of a sub-emitter collector region 21 of said bipolar transistor structure 7. It also provides a retrograde diode well definition mask with a retrograde diode well opening 22 over a buried diode region 23 of said expanded buried collector layer 11 for said Schottky diode structure 8. Relatively fast-diffusing Phosphorus atoms are implanted to an $N^+$ concentration through the new 2.0 mask to form, among other sub-elements, said retrograde diode well 9. Alternatively, and as illustrated in FIG. 3A, a new 2.0 SEC mask may be formed to provide only said retrograde diode well definition mask with said retrograde diode well opening 22, thereby eliminating the formation of said sub-emitter collector region 21.

Said retrograde diode well 9 is localized within said expanded buried collector layer 11 to underlay said diode junction 10. Specifically, said retrograde diode well 9 is arranged to be in vertical alignment with said diode junction 10, in substantially the same cross-sectional area. The dimensions of said retrograde diode well 9 may be tailored to the particular characteristics of said bipolar transistor structure 7. In the preferred embodiment of the present invention, Phosphorus atoms are used for the $N^+$ concentration implant of said retrograde diode well 9, as well as the optional sub-emitter collector region 21, for faster up-diffusion during subsequent annealing steps so as to provide retrograde concentrations extending into the subsequently deposited lightly-doped epitaxial layer 13.

The 3.0 mask, etch and implant sequence is used to define and implant channel stop regions 24 adjacent to all structures. Boron atoms are implanted to a $P^+$ concentration in said channel stop regions 24. Said lightly-doped epitaxial layer 13, a single crystal layer of n-type silicon, is then deposited uniformly over all structures in a blanket epitaxial deposition sequence without a mask.

Figure 4:
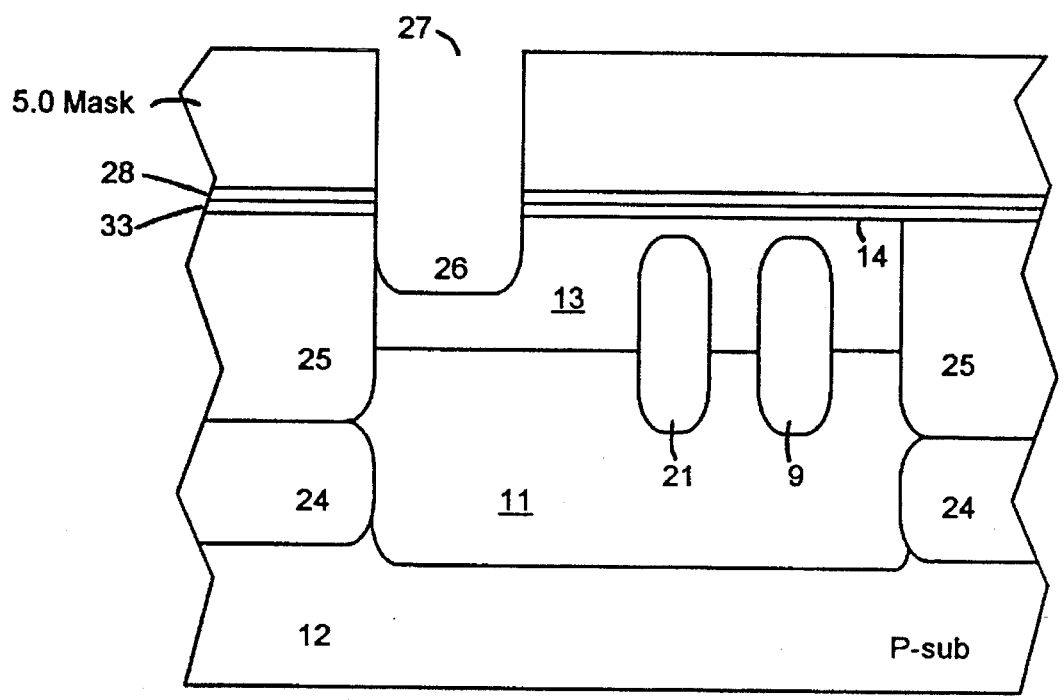
FIG. 4 is a simplified diagrammatic elevation view of the 5.0 collector sink region definition mask, etch and implant sequence of the bipolar transistor fabrication process, showing the upward diffusion of the sub-emitter collector region and the retrograde diode well of the new Schottky transistor.

Referring to FIG. 4, isolation oxide regions 25 are established around adjacent structures using the 4.0 isolation oxide mask, etch and oxidation sequence. A collector sink region 26 is then formed in said epitaxial layer 13 using the 5.0 mask, etch and implant sequence. The 5.0 mask is formed to provide a collector sink definition and implant mask with a collector sink opening 27. Relatively fast-diffusing Phosphorus atoms in an $N^+$ concentration are implanted through the 5.0 mask to form said collector sink region 26 of said bipolar transistor structure 7. The 5.0 mask is also formed for implanting said isolation oxide regions 25 with the same Phosphorus atoms to act as a gettering agent. A uniform nitride layer 28 is then deposited in a blanket chemical vapor deposition across all structures.

The 6.0 active mask is formed for etching said nitride layer 28. Openings in the 6.0 mask define field oxide regions which frame surfaces of adjacent structures. In addition, the 6.0 mask functions as a collector/base surface spacer region definition mask for the formation of a collector/base surface spacer region 29 of said bipolar transistor structure 7 in a subsequent oxidation sequence. In the 7.0 active strip mask steps said nitride layer 28 is stripped on all surfaces except over said bipolar transistor structure 7. A polycrystalline silicon layer is then deposited over all structures in a blanket deposition.

Figure 5:
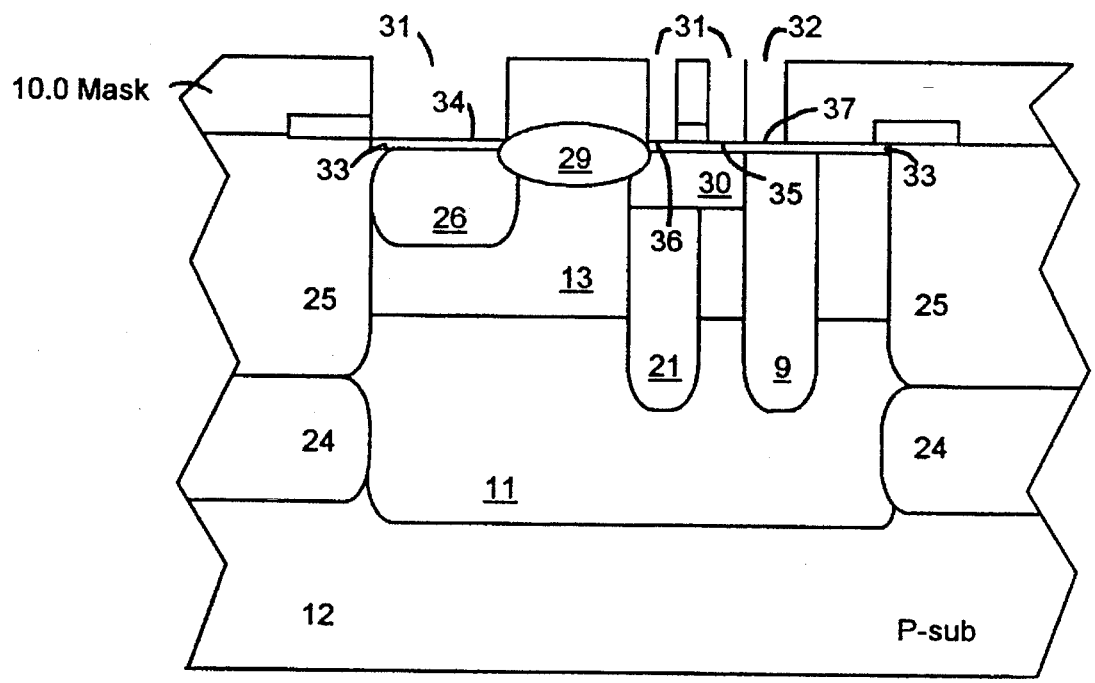
FIG. 5 is a simplified diagrammatic elevation view of the 10.0 contact region definition mask and etch sequence of the bipolar transistor fabrication process, showing the new 10.0 contact regions mask with the contact regions of the bipolar transistor structure and the new diode junction definition opening for the new Schottky diode structure.

Referring to FIG. 5, the 9.0 mask, etch and implant sequence is used for defining and implanting a base region 30 of said bipolar transistor structure 7. The 10.0 nitride etch mask is formed to provide not only a collector, base and emitter contact definition mask with collector, base and emitter contact openings 31 for said bipolar transistor structure 7, but also a diode junction contact region opening 32. An epitaxial oxide layer 33 over said bipolar transistor structure 7 is screen oxide for later donor implants. The new 10.0 mask defines a collector contact region 34, a base contact region 35, an emitter contact region 36 of said bipolar transistor structure 7, and a diode junction contact region 37 of said diode structure 8.

The 11.0 emitter and collector sink mask and implant step is utilized to further dope an emitter region 38 and said collector sink region 26 of said bipolar transistor structure 7 with an $N^+$ concentration of N type Arsenic atoms. While prior annealing steps initiated up-diffusion of said collector sink region 26, and said retrograde diode well 9, subsequent annealing completes development of the donor concentration profile throughout those regions. This full development includes the retrograde diffusion of said retrograde diode well 9 substantially to said epitaxial layer surface 14 in preparation of the formation of said diode junction 10 of said Schottky diode structure 8. Following the 11.0 mask implant, a blanket low temperature oxide (LTO) layer 39 is deposited over all structures.

Figure 6:
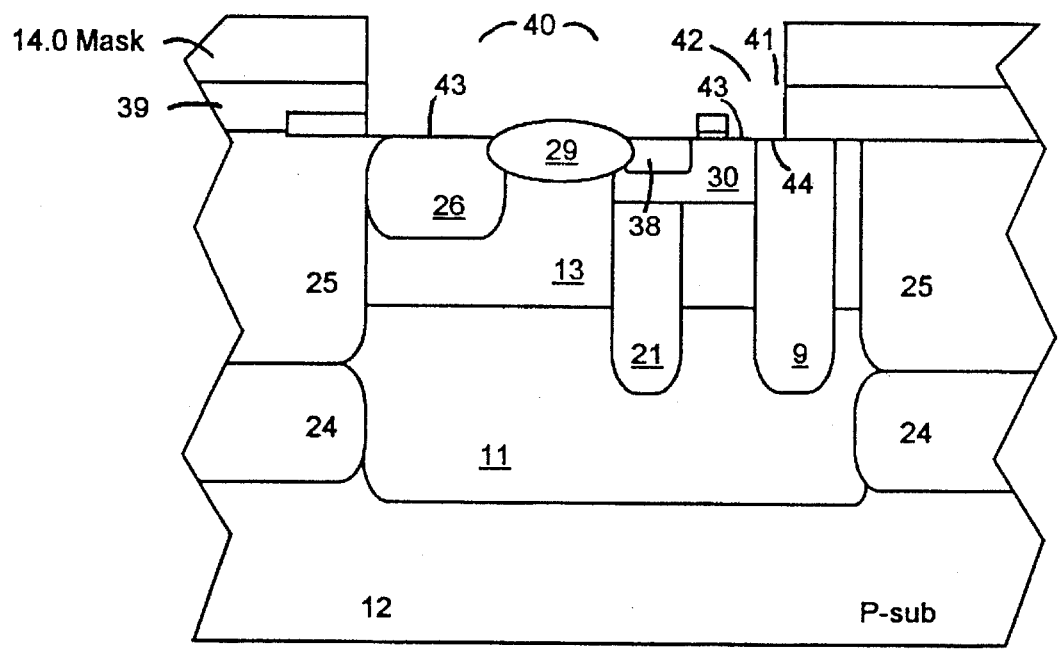
FIG. 6 is a simplified diagrammatic elevation view of the 14.0 contact define mask and etch and Platinum deposition sequence of the bipolar fabrication process, showing the new 14.0 contacts definition mask with the contact regions of the bipolar transistor and the diode junction opening described in the preferred embodiment of the invention.
Figure 7:
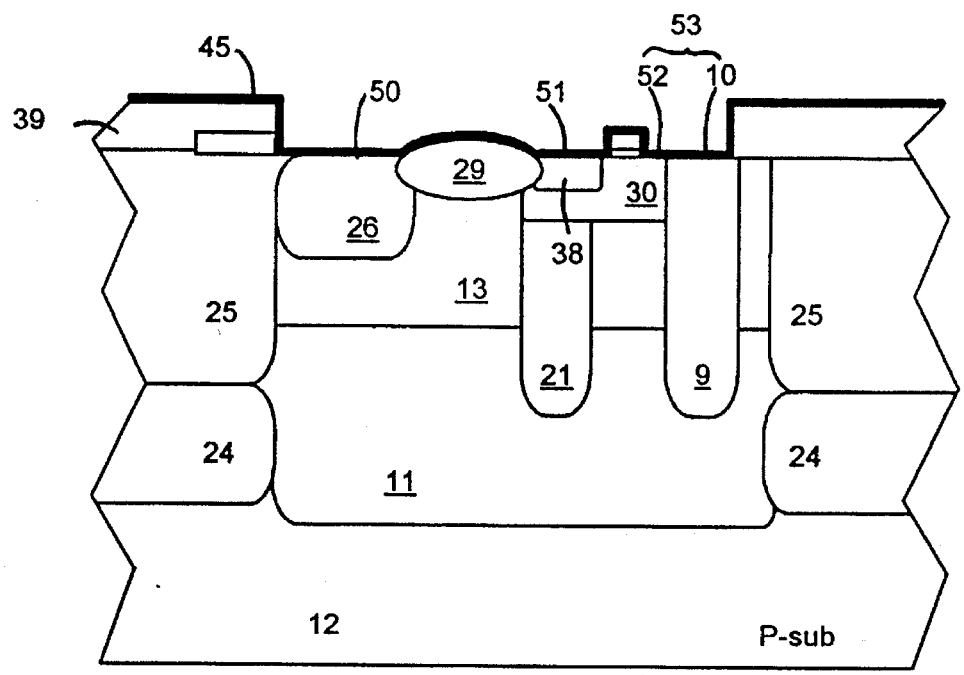
FIG. 7 is a simplified diagrammatic elevation view of the Platinum deposition sequence of the bipolar transistor fabrication process, showing the Platinum blanket deposition on all surfaces of the new Schottky transistor structure.

Referring to FIGS. 6 and 7, said diode junction 10 is formed by first depositing a new photo-resist layer to form the 14.0 mask as part of the new 14.0 mask, etch and deposition sequence. The 14.0 mask is formed to provide not only the bipolar transistor contact definition mask with bipolar transistor structure contact openings 40, but also a diode junction contact definition mask with a diode junction opening 41 wherein a base contact opening 42 of said transistor contact openings 40 is expanded to include said diode junction opening 41. Subsequent etching of said LTO layer 39 leaves bipolar transistor structure contact definition regions 43 and a diode junction contact definition region 44.

As illustrated in FIG. 7, a blanket Platinum layer 45 is deposited on all structures and subsequent sintering forms a Platinum-Silicide composite at all of the exposed contact definition regions, resulting in a collector contact 50, an emitter contact 51 and a base contact 52. For said Schottky diode structure 8, said Platinum-Silicide composite forms said diode junction 10 at said diode junction region 44 because the concentration of donors at said diode junction 10 is less than about $5 \times 10^{17}$. In the preferred embodiment of the present invention said diode junction 10 is formed as part of an expanded base contact 53, due to the expansion of said base contact opening 42. A Ti/W blanket layer 46 and then an Al/Cu blanket layer 47 are deposited on all structure surfaces. These metals form the basis of Metal 1 (M1) contacts for all active regions of said bipolar transistor structure 7 and said Schottky diode structure 8.

Figure 8:
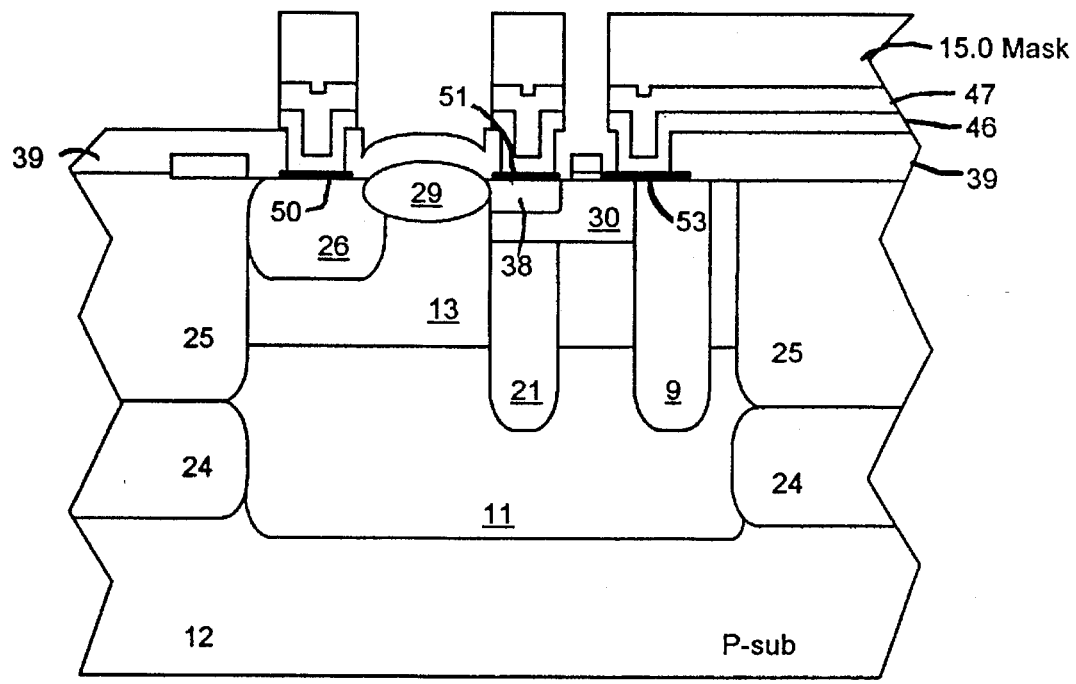
FIG. 8 is a simplified diagrammatic elevation view of the 15.0 mask and etch sequence of the bipolar transistor fabrication process showing the new 15.0 Metal 1 definition mask with the new Metal 1 diode definition contact for the improved Schottky diode structure and the photo-resist mask over the contact regions.

As illustrated in FIGS. 8 and 9, a photo-deposit layer is deposited to form the 15.0 M1 mask. The 15.0 mask is formed to provide openings for subsequent etching of said Ti/W blanket layer 46 and said Al/Cu blanket layer 47 over portions of said bipolar transistor structure 6. Following the etching of said Ti/W blanket layer 46 and said Al/Cu blanket layer 47, an interlayer dielectric 48 is deposited over all structures. Said interlayer dielectric 48 is masked and etched using the 16.0 VIA mask and etch sequence, followed by deposition of a second metal layer 49 using the 17.0 Metal 2 (M2) mask and deposition sequence. The final passivation etch and mask sequence cuts holes in said nitride layer 28 for bond pads.

While the invention has been described with reference to particular example embodiments, it is intended to cover all modifications and equivalents within the scope of the following claims.

We claim:

1. A Schottky transistor structure having a substrate of semiconductor material of first conductivity type and an epitaxial of semiconductor material of second conductivity type deposited over said substrate, said Schottky transistor comprising:

a. a bipolar transistor having:
      i. a collector region formed of said semiconductor material of second conductivity type formed in said epitaxial layer;
      ii. a base region of said semiconductor material of first conductivity type formed in said epitaxial layer;
      iii. an emitter region of said semiconductor material of second conductivity type formed in the surface of said base region; and
      iv. a buried collector layer of said semiconductor material of second conductivity type formed in said substrate and underlying said collector region and said base region; and b. a Schottky diode structure adjacent to said base region, said Schottky diode structure having a diode junction in electrical contact with said base region of said bipolar transistor, and a retrograde diode well underlying said diode junction, said retrograde diode well formed of said semiconductor material of second conductivity type in a charge carrier concentration greater than the charge carrier concentration of said epitaxial layer and distributed in a retrograde diffusion upward from said substrate, wherein said retrograde diode well is in electrical and physical contact with said diode junction, wherein a single contact layer on the surface of said base region and on the surface of said retrograde well, wherein said single contact layer forms a base contact of said base region and said diode junction of said Schottky diode.

2. The Schottky transistor structure as claimed in claim 1 further comprising a sub-emitter collector region underlying said emitter region and said base region, wherein said sub-emitter region is in physical contact with said base region and said buried collector layer.

3. The Schottky transistor structure as claimed in claim 1 wherein said semiconductor material of first conductivity type is P type and said semiconductor material of second conductivity type is N type.

4. The Schottky transistor structure as claimed in claim 3 wherein said N type semiconductor material of said retrograde diode well includes Phosphorus atoms.

5. The Schottky transistor structure as claimed in claim 4 wherein said retrograde diode well has a Phosphorus atom concentration of about $2\times10^{16}$ atoms/cc near said diode junction and a Phosphorus atom concentration of about $1\times10^{17}$ atoms/cc near said buried collector layer.

6. The Schottky transistor structure as claimed in claim 1 wherein said base contact and said diode junction are Platinum-Silicide junctions.

7. A Schottky transistor structure having a substrate of semiconductor material of first conductivity type and an epitaxial layer of semiconductor material of second conductivity type deposited over said substrate, said Schottky transistor comprising:

a. a bipolar transistor having:
   i. a collector region formed of said semiconductor material of second conductivity type formed in said epitaxial layer;
   ii. a base region of semiconductor material of first conductivity type formed in said epitaxial layer;
   iii. an emitter region of said semiconductor material of second conductivity type formed in the surface of said base region;
   iv. a buried collector layer of said semiconductor material of second conductivity type formed in said substrate and underlying said collector region and said base region; and
   v. a sub-emitter collector region of said semiconductor material of said second conductivity type formed in said epitaxial layer underlying said base region and said emitter region; and b. a Schottky diode structure adjacent to said base region, said Schottky diode structure having a diode junction in electrical contact with said base region of said bipolar transistor, and a retrograde diode well underlying said diode junction, said retrograde diode well formed of said semiconductor material of second conductivity type in a charge carrier concentration greater than the charge carrier concentration of said epitaxial layer and distributed in a retrograde diffusion upward from said substrate, and wherein said retrograde diode well is in electrical and physical contact with said diode junction, wherein a single contact layer on the surface of said base region and on the surface of said retrograde well, wherein said single contact layer forms a base contact of said base region and said diode junction of said Schottky diode.

8. The Schottky transistor structure as claimed in claim 7 wherein said semiconductor material of first conductivity type is P type and said semiconductor material of second conductivity type is N type.

9. The Schottky transistor structure as claimed in claim 8 wherein said sub-emitter collector region and said retrograde diode well are formed of the same concentration of Phosphorus atoms.

* * * * *